(12) United States Patent
Hiraga

(10) Patent No.: US 6,362,497 B1
(45) Date of Patent: Mar. 26, 2002

(54) SEMICONDUCTOR INTEGRATED CIRCUIT HAVING ESD/EOS PROTECTION

(75) Inventor: Nonaki Hiraga, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/479,117

(22) Filed: Jan. 7, 2000

(30) Foreign Application Priority Data

Jan. 8, 1999 (JP) ............................................ 11-002597

(51) Int. Cl.$^7$ ............................................. H01L 27/10
(52) U.S. Cl. ........................ 257/203; 257/207; 438/129
(58) Field of Search ................................. 257/203, 207, 257/355, 532; 438/129

(56) References Cited

U.S. PATENT DOCUMENTS 6,078,068 A * 6/2000 Tamura ...................... 257/203

* cited by examiner

Primary Examiner—Mark V. Prenty
(74) Attorney, Agent, or Firm—Hogan & Hartson, L.L.P.

(57) ABSTRACT

A semiconductor integrated circuit equipped with an ESD/EOS protection circuit for a plurality of power sources, in which the I/O region is partitioned to form a plurality of partitioned I/O regions each having an ESD/EOS protection circuit for a power source system. Logic circuitry is formed in a core area, which also contains a region where power source system protective elements for the ESD/EOS protection circuit are formed for at least some of partitioned I/O regions. The power source system protective elements formed within the core region may be diodes, condensers, or MOS transistors or other MOS structures. The power source system protective elements may be formed in the same well in the substrate where elements of the logic circuitry is formed, or in separate wells.

12 Claims, 8 Drawing Sheets

SEMICONDUCTOR INTEGRATED CIRCUIT HAVING ESD/EOS PROTECTION

BACKGROUND OF THE INVENTION

1. Field of the Invention

This invention relates to a semiconductor integrated circuit having a plurality of power source systems, and more specifically, to a semiconductor integrated circuit having an ESD/EOS protection circuit for each of the power sources system.

2. Description of the Related Art

FIG. 5 shows the configuration of a semiconductor integrated circuit (IC) with a single power source system according to the related art. In this figure, the semiconductor integrated circuit 21 has a core area 22 and an I/O region 23. A logic circuit such as a gate array or embedded array is formed in the core area 22. An electrostatic discharge (ESD) and electrical overstress (EOS) protection circuit is situated in the I/O region 23 along with an Input/Output circuit such as an I/O buffer in order to protect the semiconductor integrated circuit 21 against external electrostatic discharges and electrical stress. A thick power source line B connected to the power source and a ground line G are wired in the I/O region 23 for the I/O buffer and the ESD/EOS protection circuit. An I/O pad (not shown) for the input and output of signals to and from the semiconductor chip is wired in the I/O region 23 or to the outside of the I/O region 23.

FIG. 6 shows the ESD/EOS protection circuit. In this figure, the connection points on the Input /Output pad P21 and the I/O buffer are connected to the power source line B at an electrical potential of Vdd via a protective diode D21, and to the ground line G at an electrical potential of Gnd via another protective diode D22. A number of power source system protection circuit elements, such as diode D23, condenser C21, and MOS transistors Tr21 and Tr22, are distributed and connected between the power source line B and the ground line G. There may also be protective diodes (not shown) connected to the power source line B and the ground line G from the Input/Output pads of the Input/Output circuits in the same manner as the protective diodes D21 and D22.

In the ESD/EOS protection circuit, a high positive voltage applied to the Input/Output pad P21 is sent to the power source line B though the protective diode D21 and absorbed by the power source system protective elements connected between the power source line B and the ground line G. A high negative potential applied to the Input/Output pad P21 is sent to the ground line G through the protective diode D22 and absorbed by the power source system protective elements. An irregular voltage applied to the power source line B and the ground line G is also absorbed by the power source protective elements.

The ESD/EOS protection circuit shown in FIG. 6 is situated in the I/O region 23 shown in FIG. 5 and is configured so as to perform ESD/EOS protection in a known manner. These structures are used by semiconductor integrated circuits formed with the power sources of several type. However, ESD/EOS protection circuits also have to be formed in semiconductor integrated circuits with a plurality of power source systems, such as circuits shown in FIG. 7 and FIG. 8.

FIG. 7 shows a semiconductor integrated circuit 21 with four power source systems. In FIG. 7, an ESD/EOS protection circuit is formed in the I/O region 23 along with an Input/Output circuit such as an Input/Output buffer. The power source lines for the power source systems are B-1 through B-4 and the ground line is G. In the prior art structure, these power source lines B-1 through B-4 and the ground line G must have narrow line widths in order to be formed in the I/O region 23. As a result, the performance of the ESD/EOS protection circuit is often unsatisfactory.

FIG. 8 shows another semiconductor integrated circuit 21 with four power source systems. In FIG. 8, the I/O region is partitioned into I/O regions 23-1 through 23-4 corresponding to each of the power source systems. An ESD/EOS protection circuit is formed in each one of these partitioned regions along with an Input/Output circuit such as an Input/Output buffer. There is a power source line and a ground line in each one of these partitioned regions. For example, power source line B-1' and ground line G-1 are situated in I/O region 23-1. In this configuration, the line widths of the power source lines and ground lines in these partitioned regions are adequate, but the area in which the protection circuits for each one of the power source systems can be formed is greatly reduced.

For the ESD/EOS protection to function properly, a certain number of protective elements must be provided. This number is unrelated to the number of Input/Output lines to be protected. The number of protective elements that can be formed is largely proportional to the area of the I/O region. Because the area of the partitioned regions in FIG. 8 is small, an adequate number of protective elements cannot be formed for each power source system, and ESD/EOS protection does not function properly.

SUMMARY OF THE INVENTION

Thus, when ESD/EOS protection circuits are formed in semiconductor integrated circuits with a plurality of power source systems, either the power source lines and ground lines are too narrow and the ESD/EOS protection does not function as desired, or the number of protective elements for each power source system is inadequate and the ESD/EOS protection does not function properly.

Accordingly, the present invention is directed to a semiconductor integrated circuit having a plurality of power source systems with ESD/EOS protection that substantially obviates one or more of the problems due to limitations and disadvantages of the related art.

An object of the present invention is to provide a semiconductor integrated circuit having a plurality of power source systems with adequate ESD/EOS protection, by constructing an ESD/EOS protection circuit in the semiconductor integrated circuit and partitioning the arrangement of power source system protective elements necessary to perform ESD/EOS protection irrespective of the number of protective diodes and Inputs/Outputs proportional to the number of Input/Output circuits.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the present invention provides a semiconductor integrated circuit having a substrate and a logic circuit and a plurality of power source systems formed in the substrate, the semiconductor IC including an I/O region partitioned into a plurality of partitioned I/O regions each having at least a part of one of the plurality of power source systems formed therein; a core area distinct from the I/O region and having the logic circuit formed therein; and an ESD/EOS protection circuit for each power source system, the ESD/EOS protection circuit having power source system protective elements, wherein at least some of the power source system protective elements of at least some of the ESD/EOS protection circuits are formed in the partitioned I/O region for the corresponding power source system, and at least some of the power source system protective elements of at least some of the ESD/EOS protection circuits are formed in the core area.

In such a semiconductor integrated circuits having a plurality of power source systems, the I/O region is partitioned for each one of the power source systems, and the formation of partitioned I/O regions allows the power source lines and ground lines for each one of the partitioned I/O regions to have sufficient width to provide adequate protection.

The ESD/EOS protection circuit for each power source system is configured differently so as to allow for adequate partition. It has a sufficient number of protective diodes on the Input/Output lines for connection to the power source lines and ground lines and a sufficient number of power source system protective elements for each power source system. The protective diodes are situated in the partitioned I/O regions as determined by the number and width of the I/O pads, and as many power source system protective elements are formed in the partitioned I/O regions as the areas allow. Power source protective elements that cannot fit in the partitioned I/O regions are formed in the core region, so that a sufficient number of power source system protective elements can be formed for those power source systems having few I/O pads and small areas. As a result, the ESD/EOS protection circuit in the semiconductor integrated circuit performs adequately.

In the IC device, the well region in the core area where the power source system protective elements are formed may be the same well region used for the logic circuit. Such a structure is flexible and effective because the power source system protective elements are formed with the logic circuit (e.g. a gate array) portion before the contact processing. The power source system protective elements may also be formed in a well region formed in the core area separate from the well(s) for the logic circuit, and a desired number of protective elements may be formed in the substrate for each power source system. The well array formed in the core area may be partitioned for each one of the power source systems, and a desired number of protective elements may be formed during the process following contact processing in the application level of the manufacturing process for the semiconductor integrated circuit. This structure is also flexible.

The power source system protective elements in the ESD/EOS protection circuit may be diodes and/or condensers. Such protective elements can be formed effectively without the need for other configuration means because diodes and condensers can be formed between the well region and the substrate. The protective elements may also be transistors formed in a first well, a substrate and a second well. Again, no other configuration means is necessary because the transistors can be formed on the first well, the substrate, and the second well.

In another aspect, the present invention provides a method for forming a semiconductor integrated circuit having a substrate and a logic circuit and a plurality of power source systems formed in the substrate, the method including forming at least a part of each of the plurality of power source systems in one of a plurality of partitioned I/O regions of the substrate; forming the logic circuit in a core area of the substrate distinct from the I/O regions; and forming an ESD/EOS protection circuit for each power source system, the ESD/EOS protection circuit having power source system protective elements, wherein at least some of the power source system protective elements of at least some of the ESD/EOS protection circuits are formed in the partitioned I/O region for the corresponding power source system, and at least some of the power source system protective elements of at least some of the ESD/EOS protection circuits are formed in the core area.

It is to be understood that both the foregoing general description and the following detailed description are exemplary and explanatory and are intended to provide further explanation of the invention as claimed.

DETAILED DESCRIPTION OF THE PREFERRED EMBODIMENTS

Figure 1:
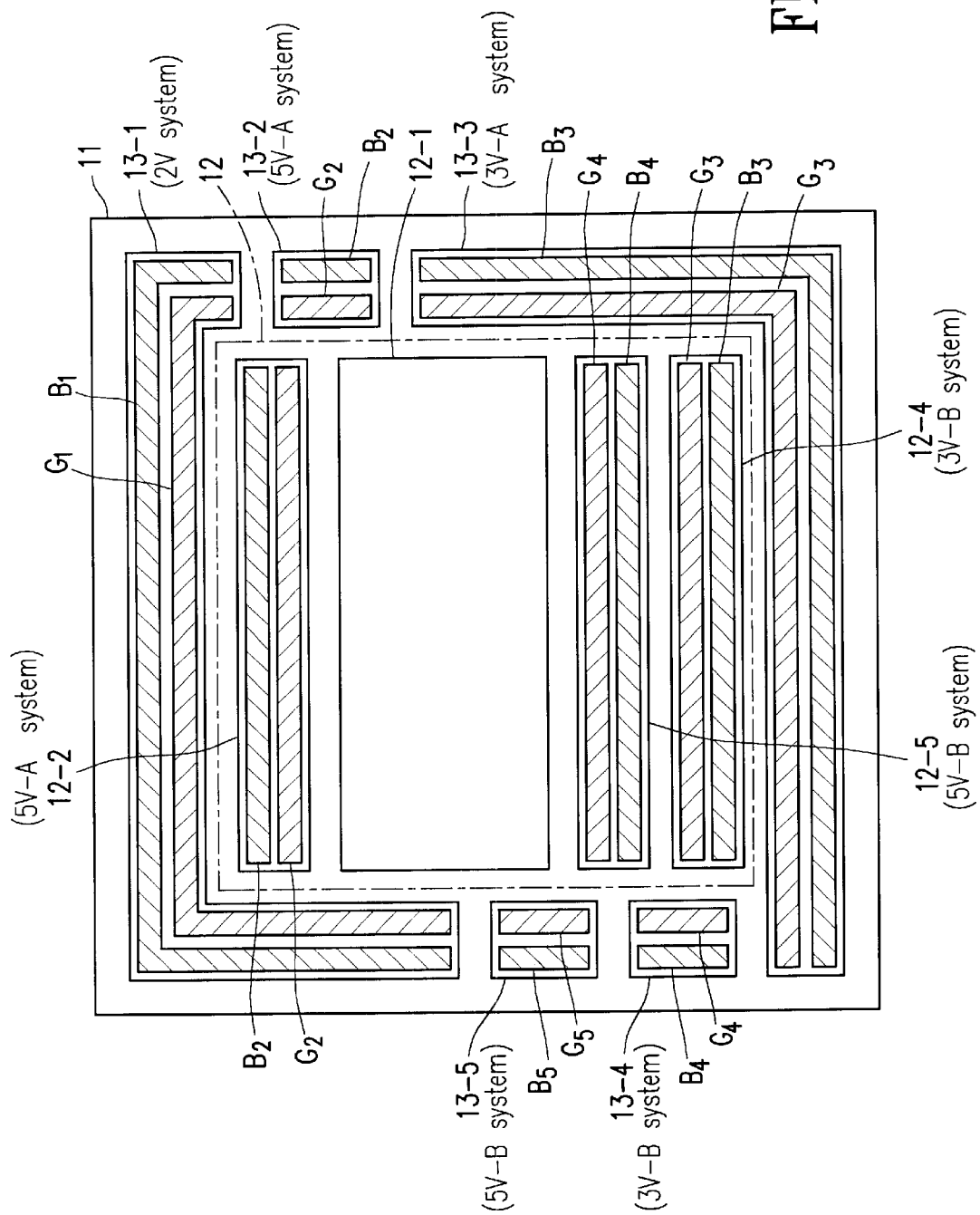
FIG. 1 illustrates a semiconductor integrated circuit with a plurality of power source systems according to an embodiment of the present invention.

Embodiments of the present invention are described with reference to the drawings. FIG. 1 shows the configuration of a semiconductor integrated circuit (IC) 11 according to the first embodiment of the present invention, the IC having a plurality of power source systems, including the following five power source systems: a 2-V system, a 5V-A system, a 3V-A system, a 3V-B system and a 5V-B system. The semiconductor integrated circuit 11 has an I/O region and a core area 12. The I/O region is partitioned for each one of the power source systems: the I/O region 13-1 is for the 2V system, the I/O region 13-2 is for the 5V-A system, the I/O region 13-3 is for the 3V-A system, the I/O region 13-4 is for the 3V-B system, and the I/O region 13-5 is for the 5V-B system.

In partitioned I/O regions 13-1 through 13-5, power source lines B1 through B5 and ground lines G1 through G5 for the above five power source system are arranged with adequate line widths. In this embodiment, the ESD/EOS protection circuit has the same circuit configuration as the ESD/EOS protection circuit of the related art shown in FIG.

Figure 6:
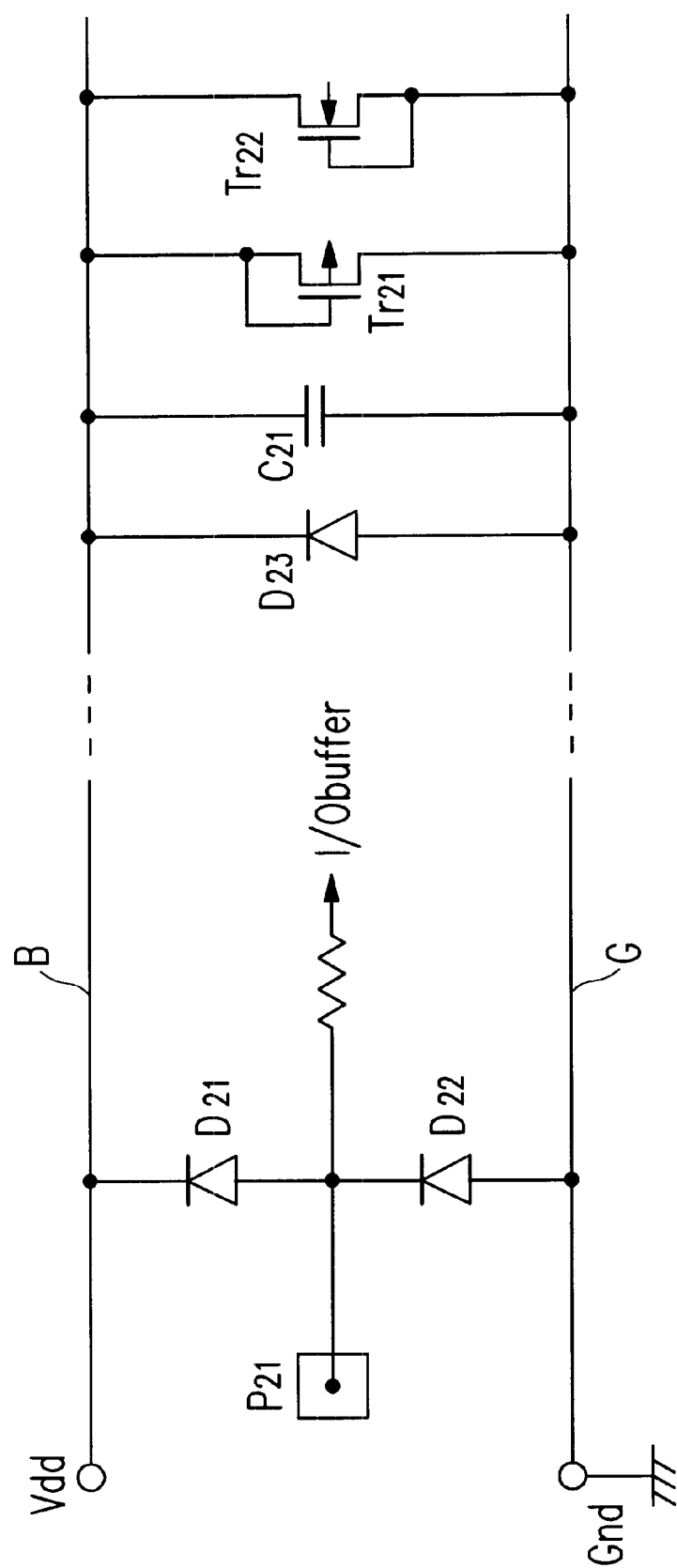
FIG. 6 is a circuit diagram showing an ESD/EOS protection circuit according to the prior art.
Figure 7:
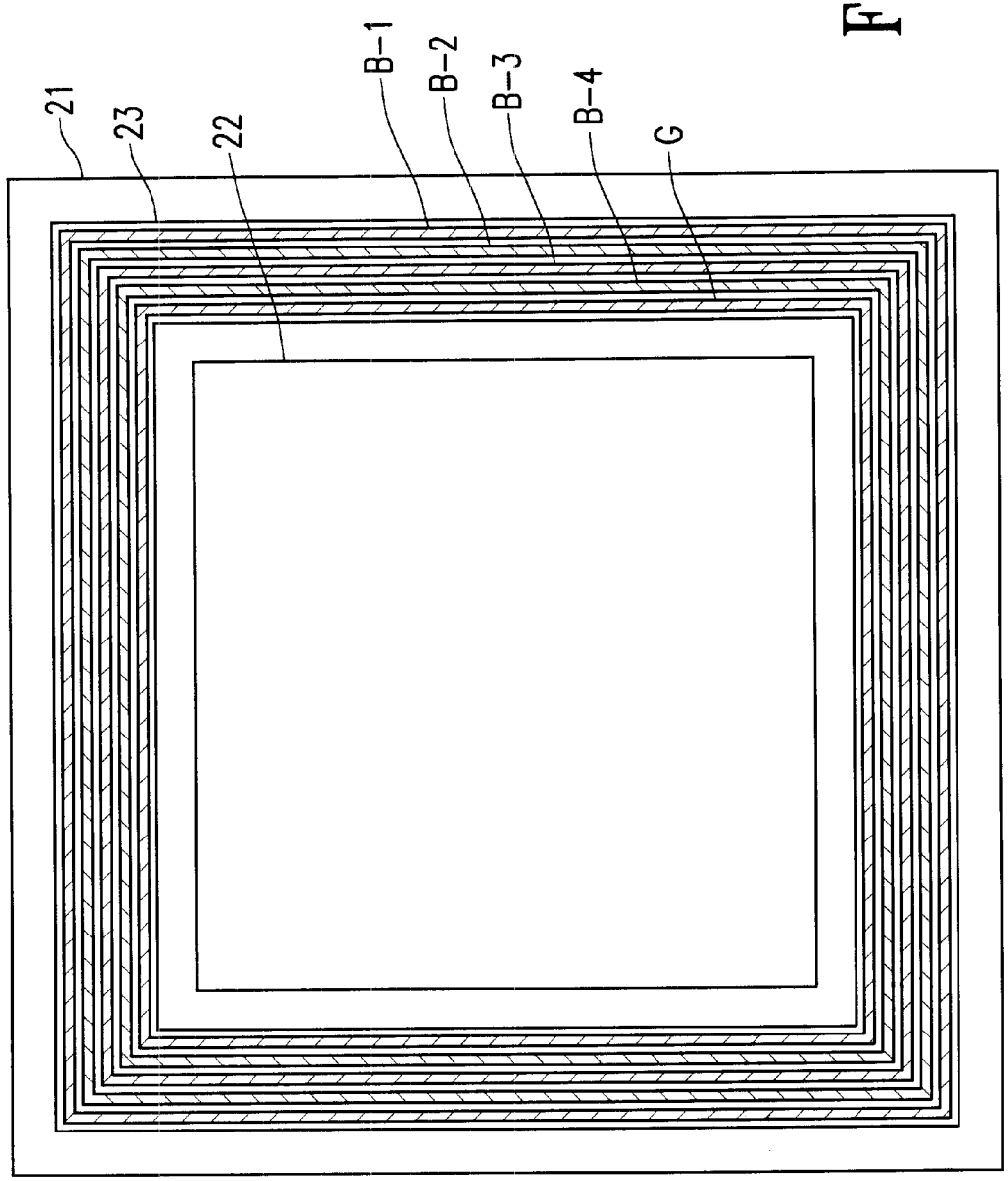
FIG. 7 illustrates a semiconductor integrated circuit with a plurality of power source systems according to the prior art.
Figure 8:
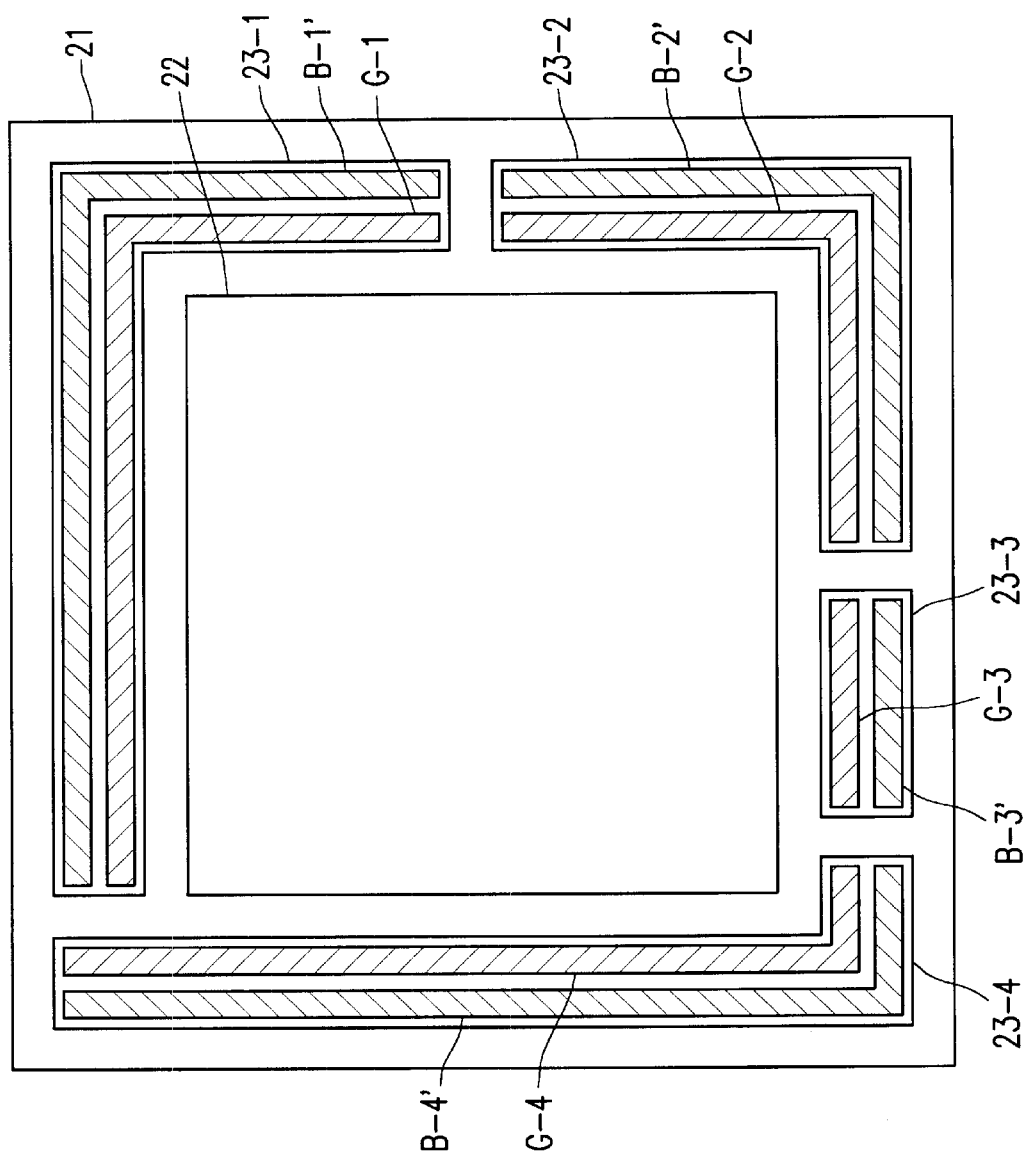
FIG. 8 illustrates another semiconductor integrated circuit with a plurality of power source systems according to the prior art.

6. As shown in FIG. 6, the protective diode D21 connecting the Input/Output line to the power source line, the protective diode D22 connecting the Input/Output line to the ground line, and the protective elements situated between the power source line and the ground line (i.e., diode D23, condenser C21, transistor Tr21 and transistor Tr22) are situated in partitioned I/O regions 13-1 through 13-5 of FIG. 1 along with an Input/Output circuit such as an I/O buffer.

Because the area of each of partitioned I/O regions 13-1 through 13-5 is essentially determined by the number of I/O pads in the respective power source system, all of the protective elements in the ESD/EOS protection circuit and the same number of protective diodes D21 and D22 as the number of I/O pads can be formed in the partitioned I/O regions 13-1 through 13-5. The power source system protective elements between the power source line and the ground line are unrelated to the number of V/O pads in the power source system. However, an adequate number of protective elements has to be included in order to protect the semiconductor integrated circuit from possible ESD and EOS. Thus, a partitioned I/O region is made as small as possible for as few I/O pads as possible, and an adequate number of power source system protective elements are placed in the partitioned I/O region.

The core area 12 comprises, in the logic formation region 12-1, ordinary logic such as a gate array or an embedded array. In the present invention, some of the core area 12 is used for the placement of protective elements composing the ESD/EOS protection circuit. This part of the core area 12 is partitioned into power source system protective element regions for the power source system partitioned I/O regions that can not contain a sufficient number of power source system protective elements for the partitioned I/O region. The power source system protective elements that could not be placed in the partitioned I/O region are placed in the partitioned power source system protective element regions in the core area 12. For example, the power source system protective element region 12-2 is for the 5V-A system I/O region 13-2 for the 5V-A system, the power source system protective element region 12-4 is for the 3V-B system I/O region 13-4 for the 3V-B system, and the power source system protective element region 12-5 is for the 5V-B system I/O region 13-5 for the 5V-B system. The I/O region 13-1 for the 2V system and the I/O region 13-3 for the 3V-A system contain a sufficient number of power source system protective elements for the high number of I/O pads because of the larger area of the respective I/O region. Thus, these regions alone contain the power source system protective elements and all of the ESD/EOS protection circuit elements for the respective I/O region.

In the semiconductor integrated circuit having a plurality of power source systems of this embodiment, the I/O region 13 is partitioned by the power source systems, and the formation of partitioned I/O regions 13-1 through 13-5 allow power source lines B1 through B5 and ground lines G1 through G5 to have sufficient widths.

In the ESD/EOS protection circuit, the protective diodes D21 and D22 connected to the power source line B and the ground line G needed for each Input/Output line, and the power source system protective elements D23, C21, Tr21 and Tr22 needed for each power source system are properly allotted. The protective diodes D21 and D22 are situated in partitioned I/O regions 13-1 through 13-5 as determined by the number and size of the I/O pads, and as many power source system protective elements D23, C21, Tr21 and Tr22 are situated in partitioned I/O regions 13-1 through 13-5 as these regions allow.

By situating those power source system protective elements that can not be situated in partitioned I/O regions 13-1 through 13-5 in the core area 12, an adequate number of power source system protective elements can be incorporated in the circuit for power source systems with few I/O pads. As a result, the ESD/EOS protection circuit in the semiconductor integrated circuit 11 having a plurality of power source systems can function properly.

Figure 2:
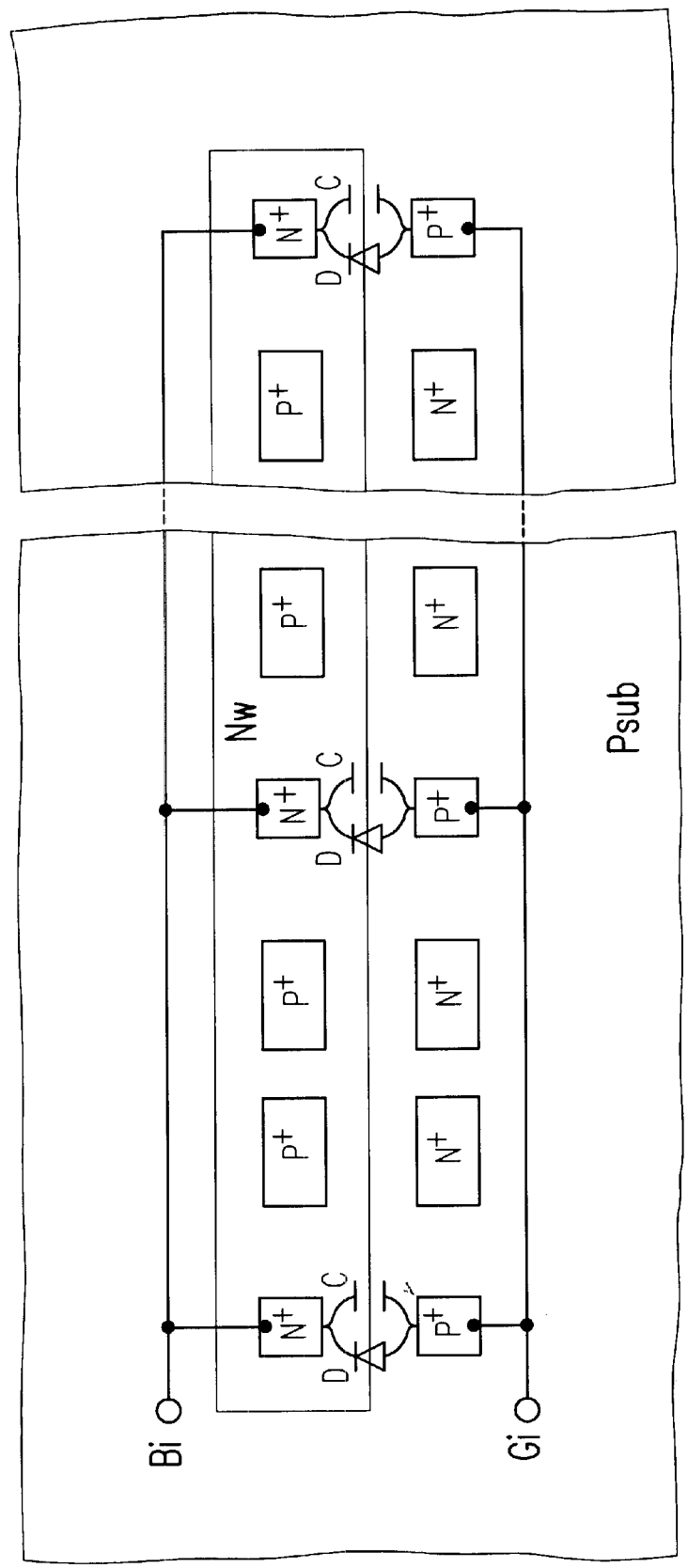
FIG. 2 shows diodes and condensers as protective elements formed in power source system protective element regions of the core area.
Figure 3:
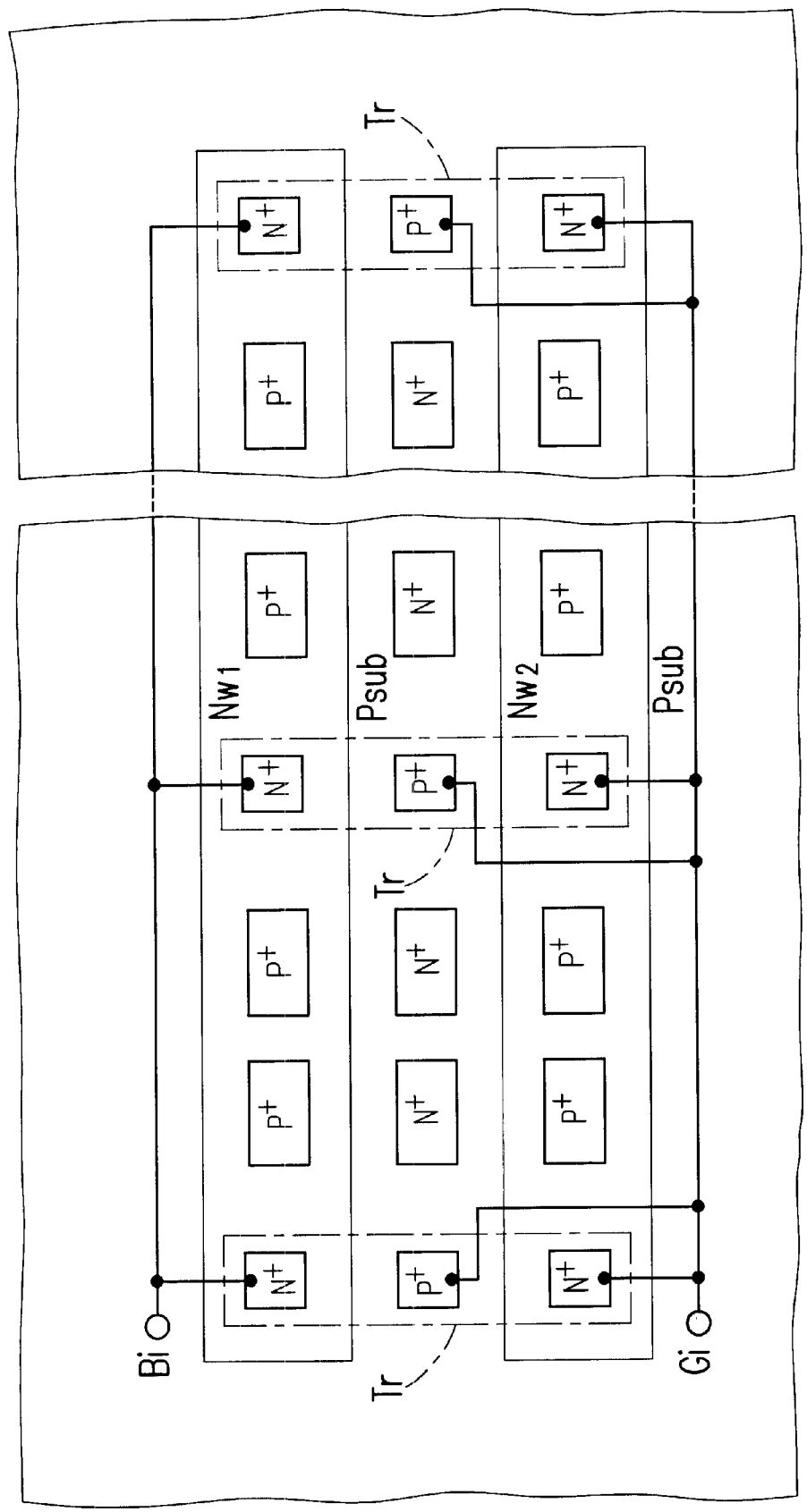
FIG. 3 shows transistors as protective elements formed in power source system protective element regions of the core area.
Figure 4:
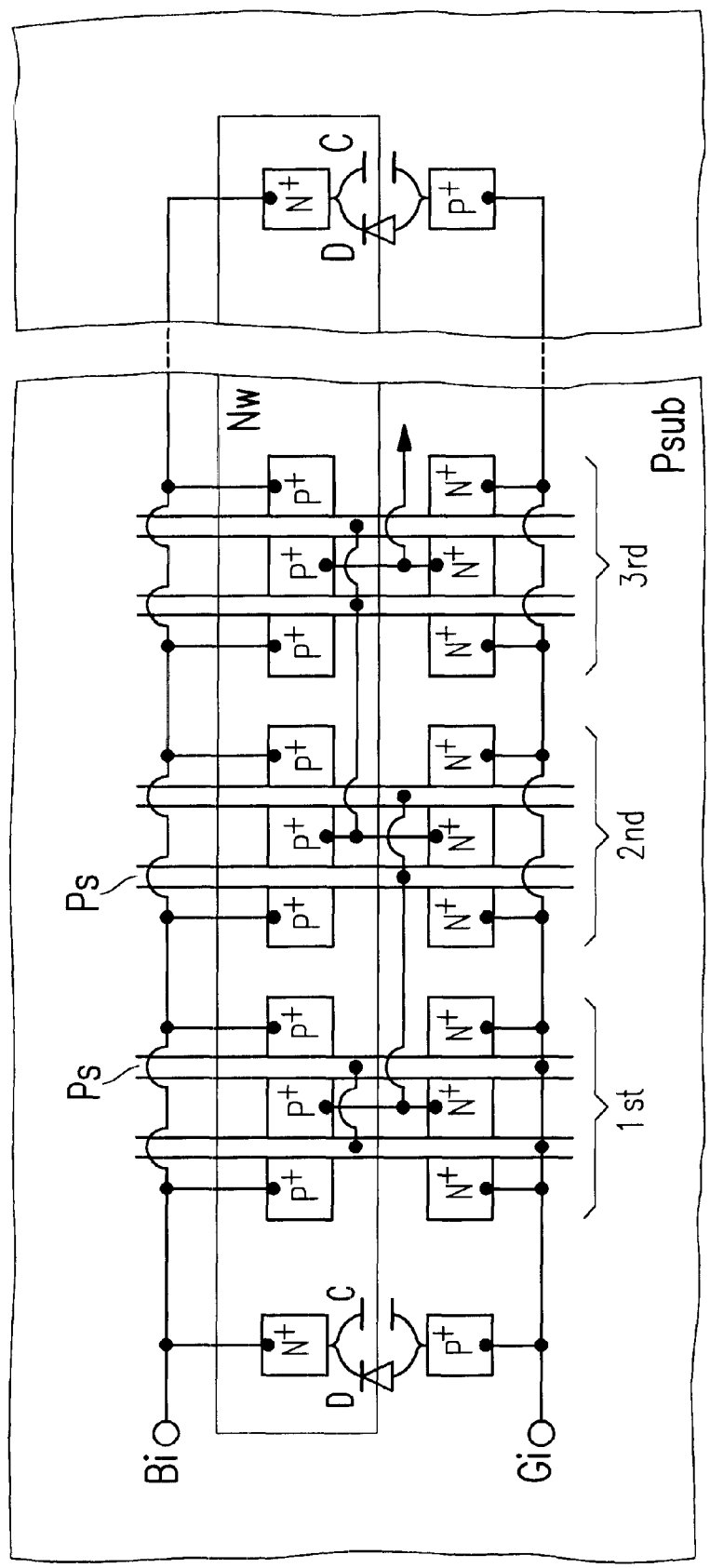
FIG. 4 shows diodes, condensers and MOS gates as protective elements formed in power source system protective element regions of the core area.
Figure 5:
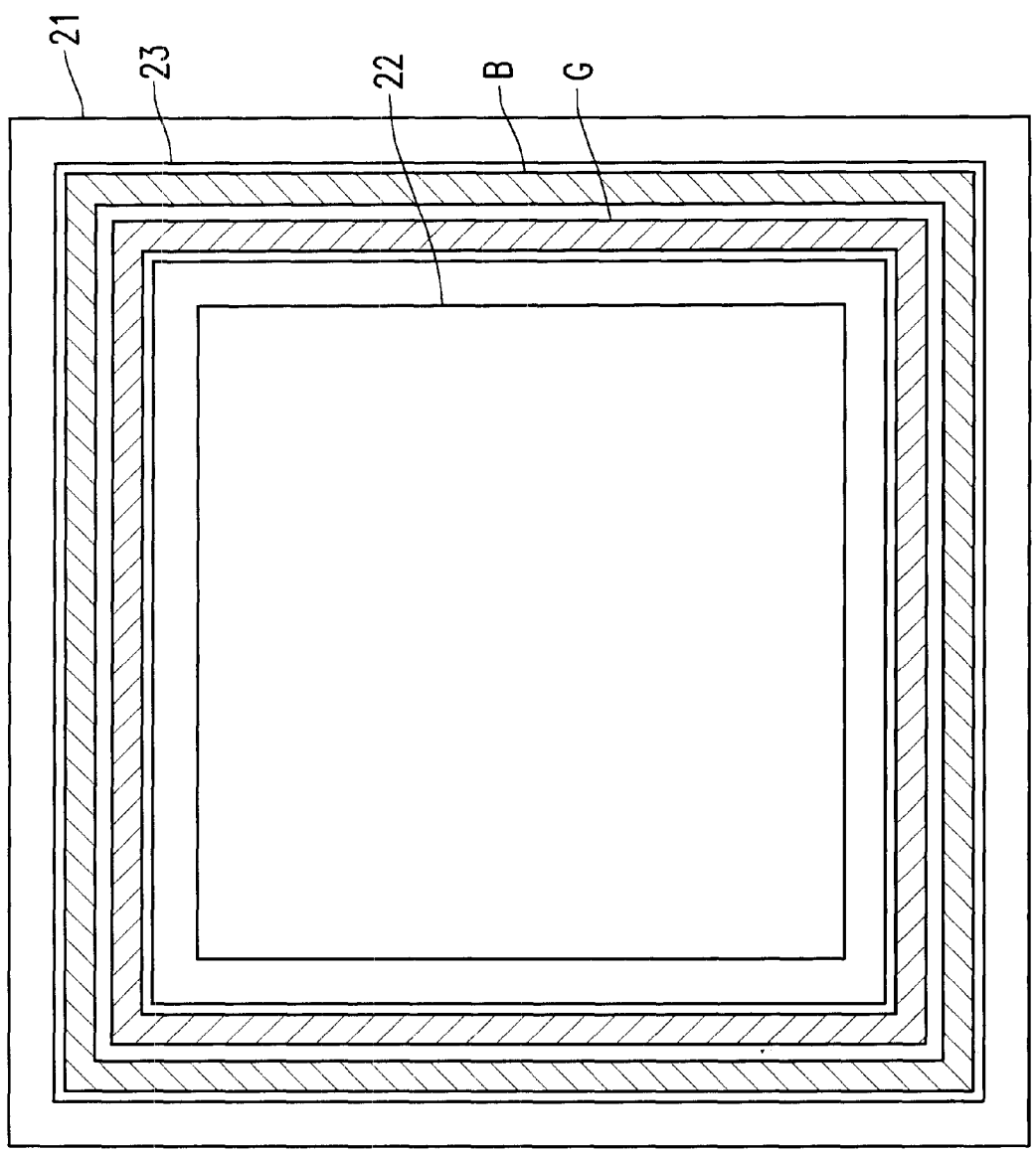
FIG. 5 illustrates a semiconductor integrated circuit with a single power source system according to the prior art.

FIGS. 2, 3 and 4 show the formation of protective elements in power source system protective element regions 12-2, 12-4 and 12-5 in the core area 12. FIG. 2 shows the formation of diodes and condensers as the protective elements in the power source system protective element regions of the core area 12. In this figure, an N well Nw is formed separately in a P-type substrate Psub. One or more N+ regions and P+ regions are formed in the N well Nw, and one or more corresponding P+ regions and N+ regions are formed in the P-type substrate Psub. These structures may be formed during the process following contact processing in the application level of the manufacturing process for the semiconductor integrated circuit 11. The N well Nw formed in the core area 12 may be partitioned for each power source system for the formation of an adequate number of power source system protective elements. If these regions are formed with the logic circuit (e.g. gate array) portion before the contact processing and the power source system protective circuit elements are formed after the contact processing, the circuit configuration is more flexible and effective.

As shown in FIG. 2, a power source line Bi is connected to the N+ regions in the N well Nw at a positive voltage, and a ground line Gi is connected to the P+ regions in the P-type substrate Psub at a ground potential. The diodes D and the condensers (electrostatic capacity) C are formed between the N well Nw and the P-type substrate Psub. Because the power source line Bi and the ground line Gi are connected to a given partitioned I/O region 13-i (i.e. one of 13-1 through 13-5), the diodes D and the condensers C function as power source system protective elements. The size and number of diodes D and condensers C may be determined by the value needed in the given partitioned I/O region 13-i.

As shown in FIG. 2, P+ regions may be optionally formed in the N well Nw and N+ regions may be optionally formed in the P-type substrate Psub. These P+ region in the N well Nw and the N+ region in the P-type substrate Psub are not used in the ESD/EOS protection circuit and are therefore not necessary, but they may be used as a part of a logic circuit.

FIG. 3 shows the formation of transistors as the power source system protective elements in the power source system protective element regions of the core area 12. In this figure, a first N well Nw1 and a second N well Nw2 are formed separately in a P-type substrate Psub. One or more N+ regions and one or more P+ regions are formed in the first N well Nw1 as well as the second N well Nw2, and one or more corresponding P+ regions and N+ regions are formed in the P-type substrate Psub. An N+ region in the first N well Nw1, a corresponding P+ region in the P-type substrate Psub, and a corresponding N+ region in the second N well Nw2 form a transistor Tr.

These structures, like those in FIG. 2, may be formed during the process following contact processing in the application level of the manufacturing process for the semiconductor integrated circuit 11, and the N wells Nw1 and Nw2 formed in the core area 12 may be partitioned for the power source systems so as to form desired numbers of power source system protective elements.

In the embodiment of FIG. 3, a power source line Bi is connected to the N+ regions of the first N well Nw1 at a positive voltage and a ground line Gi is connected to the P+ regions of the P-type substrate Psub and the N+ regions of the second N well Nw2 at a ground potential. When so connected, an N+ region in the first N well Nw1, the corresponding P+ region in the P-type substrate Psub, and the corresponding N+ region in the second N well Nw2 form a NPN-type bipolar transistor Tr. A condenser C (not shown) is also formed between the first well Nw1 and the P-type substrate Psub. The transistor Tr functions as a forward bias diode if a negative voltage is applied to the first N well Nw1; on the contrary, current flows to the second N well Nw2 if an excessive positive voltage is applied to the first N well Nw1.

Because the power source line Bi and the ground line Gi are connected to a given partitioned I/O region 13-i, the transistors and the condensers function as power source system protective elements as in the case of the working example in FIG. 2. The size and number of diodes and condensers, the P+ regions formed in the first N well Nw1 and second N well Nw2 and the N+ regions formed in the P-type substrate Psub are identical to those in the embodiment of FIG. 2. A more detailed explanation is thus omitted. When the transistors in FIG. 3 are connected as shown, the second N well Nw2 cannot be used as logic elements because of the ground potential of Nw2.

FIG. 4 shows the formation of diodes and condensers in the power source system protective regions of the core area 12 as the power source system protective elements, and the formation of punch-through devices by the logic gates as the power source system protective elements. In this figure, an N well Nw is formed separately in a P-type substrate Psub. One or more N+ regions and one or more P+ regions are formed in the N well Nw, and one or more corresponding P+ regions and N+ regions are formed in the P-type substrate Psub. Polysilicon layers Ps are then formed over the P+ region of the N well Nw and the N+ region of the P-type substrate Psub as gates of the MOS structures. These structures may be formed during the process following contact processing in the application level of the manufacturing process for the semiconductor integrated circuit 11. The N well Nw formed in the core area 12 may be partitioned for power source systems and desired numbers of power source system protective elements can be formed.

A power source line Bi is connected to the N+ regions in the N well Nw at a positive voltage, and a ground line Gi is connected to the P+ region in the P-type substrate Psub at a ground potential. A diode D and a condenser C may be formed between the well Nw and the P-type substrate Psub. A P+ region in the N well Nw, a corresponding N+ region in the P-type substrate Psub and a corresponding polysilicon layer Ps form a MOS gate in the following manner. The P+ region in the N well Nw is connected at the two end portions to the power source line Bi at a positive voltage, and the corresponding N+ region is connected at the two end portions to the ground line Gi at a ground potential. The center portions of each P+ region is connected to the center portion of the corresponding N+ region. The polysilicon gate Ps is formed of two strips of polysilicon that are connected to each other. A plurality of such MOS structures (first, second and third) are shown in FIG. 4, the MOS structures being connected to form multiple stages. As shown in the figure, the center portions of the P+ and N+ regions of a previous stage are connected to the gate polysilicon Ps of the next stage. The gate polysilicon Ps of the first stage is connected to the ground line Gi. These stages form complementary-type MOS inverters. The MOS gates allow for punch through when a high voltage is applied, and function as power source system protective elements for the ESD/EOS protection circuit. In the structure of FIG. 4, an output is not extracted from the third MOS gate, so the output is not used.

Because the power source line Bi and the ground line Gi are connected in the given partitioned I/O region 13-i, the diodes D, condensers C and MOS gates function as power source system protective elements. The size and number of these elements be determined by the values needed by the given partitioned I/O region 13-i.

It will be apparent to those skilled in the art that various modifications and variations can be made in a method of fabricating a semiconductor integrated circuit of the present invention without departing from the spirit or scope of the inventions. For example, although an N well Nw is formed in the P-type substrate Psub in the embodiments of FIGS. 2, 3 and 4, an N-type substrate and a P well formed therein may also be used. Thus, it is intended that the present invention covers the modifications and variations of this invention provided they come within the scope of the appended claims and equivalents.

What is claimed is:

1. A semiconductor integrated circuit having a substrate and a logic circuit and a plurality of power source systems formed in the substrate, comprising:

an I/O region partitioned into a plurality of partitioned I/O regions each having at least a part of one of the plurality of power source systems formed therein;

a core area distinct from the I/O region and having the logic circuit formed therein; and an ESD/EOS protection circuit for each power source system, the ESD/EOS protection circuit having power source system protective elements, wherein at least some of the power source system protective elements of at least some of the ESD/EOS protection circuits are formed in the partitioned I/O region for the corresponding power source system, and at least some of the power source system protective elements of at least some of the ESD/EOS protection circuits are formed in the core area.

2. The semiconductor integrated circuit of claim 1, wherein at least some of the power source system protective elements formed in the core area are formed in a well in which at least a part of the logic circuit is also formed.

3. The semiconductor integrated circuit of claim 1, wherein at least some of the power source system protective elements formed in the core area are formed in a well distinct from another well in which at least a part of the logic circuit is partially formed.

4. The semiconductor integrated circuit of claim 1, wherein the power source system protective elements include diodes and condensers.

5. The semiconductor integrated circuit of claim 1, wherein the power source system protective elements include transistors formed on a first well, the substrate, and a second well.

6. The semiconductor integrated circuit of claim 1, wherein each partitioned I/O region includes a power source line and a ground line for the corresponding power source system.

7. A method of forming a semiconductor integrated circuit having a substrate and a logic circuit and a plurality of power source systems formed in the substrate, the method comprising:

forming at least a part of each one of the plurality of power source systems in one of a plurality of partitioned I/O regions of the substrate;

forming the logic circuit in a core area of the substrate distinct from the partitioned I/O regions; and forming an ESD/EOS protection circuit for each power source system, the ESD/EOS protection circuit having power source system protective elements, wherein at least some of the power source system protective elements of at least some of the ESD/EOS protection circuits are formed in the partitioned I/O region for the corresponding power source system, and at least some of the power source system protective elements of at least some of the ESD/EOS protection circuits are formed in the core area.

8. The method of claim 7, wherein at least some of the power source system protective elements formed in the core area are formed in a well in which at least a part of the logic circuit is also formed.

9. The method of claim 7, wherein at least some of the power source system protective elements formed in the core area are formed in a well distinct from another well in which at least a part of the logic circuit is partially formed.

10. The method of claim 7, wherein the power source system protective elements include diodes and condensers.

11. The method of claim 7, wherein the power source system protective elements include transistors formed on a first well, the substrate, and a second well.

12. The method of claim 7, wherein the step of forming at least a part of each of the plurality of power source systems includes forming a power source line and a ground line for each power source system in the corresponding partitioned I/O region.

* * * * *